(12) United States Patent
Casey et al.

(10) Patent No.: US 6,531,717 B1
(45) Date of Patent: Mar. 11, 2003

(54) VERY LOW VOLTAGE ACTUATED THYRISTOR WITH CENTRALLY-LOCATED OFFSET BURIED REGION

(75) Inventors: Kelly C. Casey, Flower Mound, TX (US); Elmer L. Turner, Jr., Irving, TX (US)

(73) Assignee: Teccor Electronics, L.P., Irving, TX (US)

( * ) Notice: Subject to any disclaimer, the term of this patent is extended or adjusted under 35 U.S.C. 154(b) by 0 days.

(21) Appl. No.: 09/504,224

(22) Filed: Feb. 15, 2000

Related U.S. Application Data (63) Continuation-in-part of application No. 09/260,328, filed on Mar. 1, 1999.

(51) Int. Cl.$^7$ .................. H01L 29/74; H01L 31/111
(52) U.S. Cl. .................. 257/109; 257/164; 257/168
(58) Field of Search .................. 257/109, 112, 257/164, 165, 166, 168, 173, 119, 121, 126, 128, 129

(56) References Cited

U.S. PATENT DOCUMENTS

| 3,359,657 A | 12/1967 | Hedberg | |
|---|---|---|---|
| 3,975,664 A | 8/1976 | Baumbach | 317/66 |
| 4,021,837 A | * 5/1977 | Hutson | |
| 4,074,337 A | 2/1978 | Debortoli et al. | 361/124 |
| 4,086,648 A | 4/1978 | Hines et al. | 361/124 |
| 4,307,430 A | 12/1981 | Montalto et al. | 361/124 |
| 4,594,635 A | 6/1986 | Scheithauer et al. | 361/119 |
| 4,695,916 A | 9/1987 | Satoh et al. | 361/56 |
| 4,796,150 A | 1/1989 | Dickey et al. | 361/119 |
| 4,876,621 A | 10/1989 | Rust et al. | 361/58 |
| 4,876,626 A | 10/1989 | Kaczmarek | 361/119 |
| 4,901,188 A | 2/1990 | Gilberts | 361/119 |
| 4,905,119 A | 2/1990 | Webb | 361/119 |

(List continued on next page.)

FOREIGN PATENT DOCUMENTS

EP 0 472 405 A2 2/1992

OTHER PUBLICATIONS

ST SGS–Thomson Microelectronics, Data Sheet, pp. 1/8–8/8, Oct. 1997.
ST SGS–Thomson Microelectronics, Data Sheet SMP Trisil, date unknown.
Handwritten note by Jack L. Turner, Jr., depicting SGS–Thomson Low Voltage (10v) device, Mar. 1997.

*Primary Examiner*—Ngân V. Ngô
(74) *Attorney, Agent, or Firm*—Roger N. Chauza, Esq.; Chauza & Handley, L.L.P.

(57) ABSTRACT

A semiconductor thyristor device that incorporates buried regions centrally located on the chip with respect to the other semiconductor regions. By centering an upper and lower buried region, larger-area contacts can be realized, thereby increasing the current capability of the device. In order to achieve low breakover voltage devices, the buried regions are offset laterally with respect to the respective emitter regions. The low voltage thyristor devices can be incorporated into five-pin protection modules for protecting customer circuits.

23 Claims, 6 Drawing Sheets

U.S. PATENT DOCUMENTS

| | | | |
|---|---|---|---|
| 4,907,120 A | 3/1990 | Kaczmarek et al. | 361/119 |
| 4,939,619 A | 7/1990 | Borkowicz et al. | 361/117 |
| 4,944,003 A | 7/1990 | Meyerhoefer et al. | 379/412 |
| 4,958,253 A | 9/1990 | Gilberts et al. | 361/119 |
| 4,958,254 A | 9/1990 | Kidd et al. | 361/119 |
| 4,964,160 A | 10/1990 | Traub et al. | 379/412 |
| 4,967,256 A | 10/1990 | Pathak et al. | 357/38 |
| 5,001,537 A | 3/1991 | Colman et al. | 357/38 |
| 5,031,067 A | 7/1991 | Kidd et al. | 361/119 |
| 5,101,317 A | 3/1992 | Cwirzen et al. | 361/119 |
| 5,150,271 A | 9/1992 | Unterweger et al. | 361/119 |
| 5,155,649 A | 10/1992 | Hung et al. | 361/119 |
| 5,172,296 A | 12/1992 | Kaczmarek | 361/119 |
| 5,175,662 A | 12/1992 | DeBalko et al. | 361/119 |
| 5,224,012 A | 6/1993 | Smith | 361/119 |
| 5,296,646 A | 3/1994 | Capper et al. | 174/51 |
| 5,341,270 A | 8/1994 | Kaczmarek | 361/119 |
| 5,357,568 A | 10/1994 | Pelegris | 361/119 |
| 5,359,657 A | 10/1994 | Pelegris | 379/412 |
| 5,365,660 A | 11/1994 | Capper et al. | 29/884 |
| 5,371,647 A | 12/1994 | Fried et al. | 361/119 |
| 5,398,152 A | 3/1995 | Borkowicz et al. | 361/119 |
| 5,422,779 A | 6/1995 | Borkowicz et al. | 361/119 |
| 5,429,953 A | 7/1995 | Byatt | |
| 5,438,619 A | 8/1995 | Shannon et al. | 379/412 |
| 5,479,031 A | 12/1995 | Webb et al. | 257/173 |
| 5,490,215 A | 2/1996 | Pelegris | 379/412 |
| 5,500,377 A * | 3/1996 | Flores et al. | |
| 5,523,916 A | 6/1996 | Kaczmarek | 361/119 |
| 5,643,014 A | 7/1997 | Filus et al. | 439/680 |
| 5,696,391 A | 12/1997 | Bernier | |
| 5,719,413 A | 2/1998 | Bernier | |
| 5,753,943 A | 5/1998 | Okabe et al. | |
| 6,262,443 B1 * | 7/2001 | Ballon et al. | 257/121 |

* cited by examiner

VERY LOW VOLTAGE ACTUATED THYRISTOR WITH CENTRALLY-LOCATED OFFSET BURIED REGION

RELATED APPLICATION

This application is a continuation-in-part of pending U.S. application Ser. No. 09/260,328, filed Mar. 1, 1999, entitled "Low Voltage Four-Layer Device with Offset Buried Region", the entire subject matter of which is incorporated herein by reference.

TECHNICAL FIELD OF THE INVENTION

The present invention relates in general to thyristors and other four-layer devices, and more particularly to the fabrication of thyristor devices having low breakover voltages.

BACKGROUND OF THE INVENTION

Thyristors, SIDACtor® overvoltage devices and other four-layer devices are commonly used to provide overvoltage protection to circuits requiring the same. The SIDACtor® overvoltage devices are two-terminal thyristors that have bidirectional current carrying capability. Such devices are obtainable from Teccor Electronics at many different breakover voltage values. When utilized in conjunction with telephone lines, for example, of the type in which 220 volt ringing signals are carried, a 250 volt breakover voltage SIDACtor® overvoltage device can be utilized to allow normal operation of the telephone line, but operate at 250 volts, or greater, in response to lightning strikes or power line crosses to thereby safely clamp the line to a very low voltage. This type of a device provides high surge current capabilities for protecting equipment from damage due to the extraneous voltages that may be coupled to the telephone line. Five-pin telephone line protection modules utilizing these high voltage devices have typically been commercially available.

Many telephone circuits and equipment operate on a −48 volt supply voltage. To that end, SIDACtor® overvoltage devices that operate at a nominal 64 volts are often utilized to protect such type of circuits. A nominally operating 30 volt SIDACtor® device can be advantageously utilized to protect many 24 volt circuits, such as fire alarm and other systems, that are susceptible to extraneous voltages. It can be appreciated that the lines that generally require protection from damage due to extraneous voltages are often in environments where energy from lightning strikes can be induced into the lines, where high voltage AC circuits are in close proximity thereto, and for a host of other reasons.

While low-voltage digital lines, such as those driven by 5-volt TTL drivers are extensively employed in computerized and other equipment, such lines have not yet found a large application in outside installations. However, in view of the fact that computer networks and communications are increasing at a substantial rate, such low-voltage lines are being used in environments where overvoltage protection is required. Such overvoltage protection need not be due solely to lightning and power line crosses, but can be due to other standard voltages that are commonly found in indoor equipment.

It is well known in the thyristor and SIDACtor® overvoltage device field that the impurity level of a semiconductor wafer can be adjusted to thereby achieve a desired breakover voltage. It is commonly known that lightly-doped silicon substrates are characterized by high breakover voltages. As the doping or impurity level of the substrate is increased, the breakover voltage is reduced. It is also well known that the impurity level of a semiconductor material is inversely proportional to the resistivity thereof.

Figure 1:
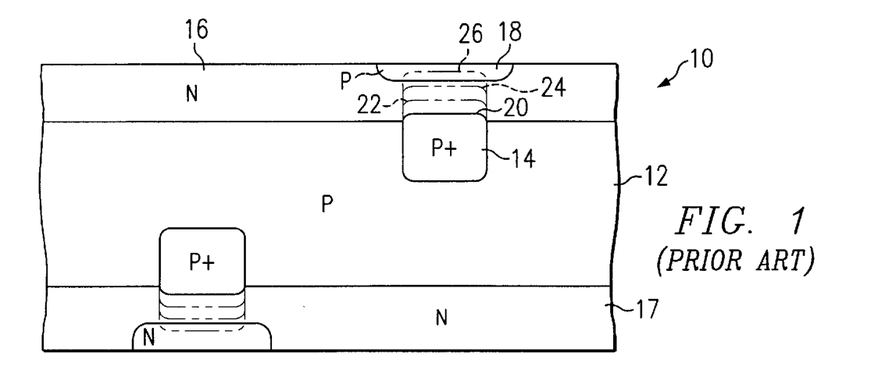
FIG. 1 is a cross-sectional view of a low breakover voltage SIDACtor® device constructed in accordance with the prior art.

It has also been found that the use of buried regions in the semiconductor substrate facilitates the operational characteristics of a SIDACtor® overvoltage device. See, for example, U.S. Pat. No. 5,479,031 by Webb. Referring to FIG. 1, if the SIDACtor® device is constructed so as to have an N-type emitter 18, a P-type base 16 and an N-type substrate 12 or mid-region, a heavily doped P-type buried region 14 can be implanted between the base region 16 and the silicon substrate 12 to thereby reduce the breakover voltage. Important advantages are achieved when the buried region 14 is directly beneath the emitter region 18, with the base region 16 material therebetween. Without significantly changing the impurity levels of the emitter 18, base 16 and substrate 12, the breakover voltage can be changed by simply changing the impurity level of the buried region 14. Moreover, in achieving breakover voltages from 250 volts down to 64 volts, the buried region need only be more heavily doped. In like manner, to achieve 30-volt breakover voltage devices, the buried region is required to be even more heavily doped.

As the impurity level of the buried region 14 increases, the junctions 20–26 formed between the buried region 14 and the base region 16 are displaced upwardly toward the emitter region 18. Indeed, as the doping level of the buried region 14 increases, the distance between the buried region-base junction 20 and the base-emitter junction becomes smaller and smaller. The reason for this is that the junction 20 is formed at a location in the semiconductor material where the donor states of one impurity are cancelled by the acceptor states of the opposite impurity. Stated another way, the junction of two semiconductor materials exists where the impurity concentration of one region is equal to the impurity concentration of the other region. The formation of a low breakover voltage SIDACtor® overvoltage device is not an elementary task.

It has been found that to fabricate nominal 10-volt breakover voltage SIDACtor® devices, the impurity level of the buried region must be so high that the buried region can often be effectively short circuited to the emitter region. In any event, even after fine tuning the processes so as to prevent short circuiting between the buried region and the emitter, the yield of workable devices is low, and thus such devices become costly.

Another problem attendant with upward migration of the junction of the buried region is that the base region under the emitter becomes thinner. The distance in the base region between the emitter junction and the buried region junction defines, in part, a holding current ($I_h$) parameter. The holding current is that current required to maintain an on-state of the device. A thinner base region adversely affects the ability to control a desired holding current.

Various other attempts have been made to make low breakover voltage thyristors. One endeavor involves a semiconductor design in which the breakover voltage occurs at the surface of the device. In other words, the concentration of the impurities at the surface of the device is controlled to achieve a low breakdown voltage.

Standard twisted pair telephone lines are protected by various circuits from hazardous voltages and currents that may be imposed on the lines. It is a standard practice to provide primary protection by the use of five-pin protection modules in the central offices and other high density conductor applications. Such modules have a standard pin configuration so that the modules of many different suppliers can be inserted into the same type of socket.

The basic protection to telephone lines includes primary protection modules and secondary protection modules. The primary protection module provides overvoltage protection against lightning strikes and power line crosses to the telephone lines. Such primary protectors may include gas discharge tubes and other semiconductor devices that can withstand high voltages. Secondary protection circuits often include semiconductor devices, resistors, positive temperature coefficient devices and other components to provide lower voltage protection to the customer side equipment. A family of overvoltage protection SIDACtor® devices providing the secondary protection is available from Teccor Electronics, Irving, Tex. The primary protection module is effective to limit the hazardous line voltages to approximately 300 volts. The secondary protection circuits, for example in line cards, provide additional protection to the telephone lines at levels below 300 volts.

While numerous five-pin primary protection modules are commercially available to provide primary protection, there is a limited selection of five-pin secondary protection modules providing secondary protection.

Recent changes in regulatory requirements suggest the use of DC isolation as well as overvoltage protection in secondary protection circuits of certain types of equipment. This imposes additional constraints not currently satisfied by currently available devices and circuits.

From the foregoing, it can be seen that a need exists for a method and technique to fabricate low breakover voltage thyristor devices. Another need exists for a technique to fabricate low voltage thyristor devices where the breakover voltage is independent of the holding current. Yet another need exists for a thyristor device which can be reliably made with high yields, thereby reducing the cost of the devices. Another need exists for a five-pin communication line protection module for use with low voltage communication lines.

SUMMARY OF THE INVENTION

In accordance with the principles and concepts of the invention, there is disclosed a technique for fabricating low-voltage thyristor devices, which technique overcomes the disadvantages and shortcomings of the prior art.

In accordance with an edge-fired embodiment of the invention, the buried region is laterally offset from the emitter region. The upward movement of the buried region junction as a function of the impurity level does not thereby interfere or otherwise become too close to the emitter junction. In addition, because of the lateral displacement of the buried region from the emitter, the base region underlying the emitter does not vary in thickness as a function of the location of the buried region junction. This essentially makes the breakover voltage independent of the holding current value of the device.

In accordance with another feature of the invention, a deep base is provided to thereby make the mid-region of the substrate thinner. The mid-region of the substrate functions in the four-layer device as a base of one of the regenerative-connected transistors of the thyristor device. With a thinner transistor base, the gain of the device is higher, thereby allowing the thyristor device to remain in an on state with a lower holding current.

In another embodiment, a four-layer thyristor is fabricated utilizing a pair of spaced-apart emitters with the buried region disposed therebetween.

In yet another embodiment, a low voltage thyristor device is formed as a center fired device in which the buried region is formed offset from the emitter, but generally centered in the chip. This arrangement not only allows an increased device current to flow, but also facilitates assembly of the packaged device. By placing the buried region in the center of the semiconductor chip and utilizing two symmetrically oriented metal contacts, the chip self centers itself to a lead frame when reflow soldered thereto.

In yet another embodiment, a five-pin communication line protection module utilizes the low-voltage thyristor to provide low voltage line protection to other circuits, such as data systems.

BRIEF DESCRIPTION OF THE DRAWINGS

Further features and advantages will become apparent from the following description of the drawings, in which like referenced characteristics generally refer to the same parts, elements or functions throughout the views, and in which.

DETAILED DESCRIPTION OF THE INVENTION

Figure 2:
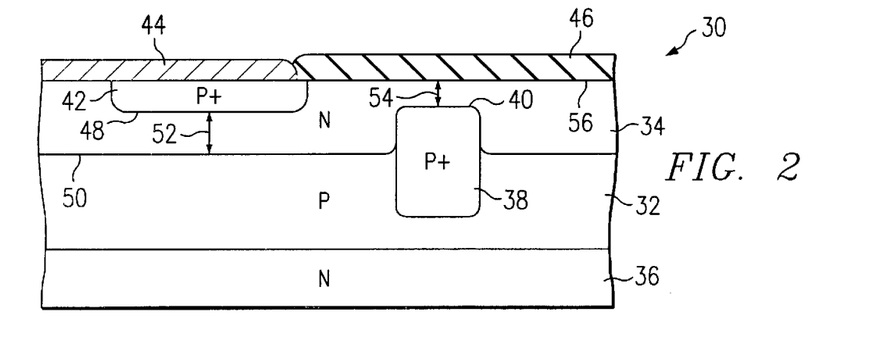
FIG. 2 is a cross-sectional view of a low voltage SIDACtor® device constructed in accordance with one embodiment of the invention.

FIG. 2 illustrates the principles and concepts of one embodiment of the invention. A single four-layer unidirectional device 30 is illustrated. Two such devices (a top surface and bottom surface device) can be formed in the semiconductor substrate to provide bidirectional current flow capabilities. The device 30 is formed in the top surface of a starting silicon substrate 32 of the P-type. Region 32 defines both the mid-region of the four-layer thyristor, and a base of a PNP transistor. An N-type base region 34 for one device is formed in the top surface of the wafer, and a second N-type base region 36 for a second device (not shown) is formed in the bottom surface of the wafer. A heavily doped buried region 38 is formed in the substrate 32, preferably by standard semiconductor diffusion techniques and before either base region 34 or 36 is formed. The buried region 38 is formed by depositing boron ions for about three days, resulting in a surface concentration of about $10^{19}$ atoms per $cm^3$, and at a depth of 80 microns. This impurity concentration at the top of the buried region 38 is effective to provide a breakover voltage in the range of 8–12 volts. The wafer undergoes the diffusion process at a temperature of about 1275° centigrade for about three days to activate the ions. After activation, a buried region junction 40 is formed in the base region 34. A P-type emitter region 42 is formed in the base region 34, but offset laterally from the buried region 38. A metal emitter contact 44 is formed in electrical contact with both the emitter region 42 and the base region 34. On the semiconductor wafer overlying the buried region 38, there is formed a dielectric layer 46 of glass, oxide or other electrically insulating material.

As can be seen from FIG. 2, the buried region 38 does not underlie the emitter region 42. Rather, the buried region 38 is offset so that the junction 40 with the base region 34 does not come into close vertical proximity to the emitter-base junction, even when the buried region junction 40 becomes increasingly shallow as the buried region 38 becomes more heavily doped. Any upward movement of the buried region junction 40 is due to the application of high processing temperatures (1275° C.) to activate the P-type ions. Indeed, even when the buried region junction 40 becomes extremely shallow due to the heavy doping of the buried region 38, there is no possibility that it would short circuit with the emitter-base junction. The arrangement of the semiconductor regions of FIG. 2 defines an edge fired thyristor device, in that the buried region 38 is located near the edge of the chip. The buried region associated with the companion unidirectional device (not shown) in FIG. 2 would be located near the bottom left of the chip, much like the positions of the buried regions shown in the prior art device of FIG. 1.

The holding current $I_h$ of the device 30 is a function of the distance 52 between the emitter-base junction 48 and the base and mid-region junction 50. As can be appreciated, the distance 52 is independent of the location of the buried region junction 40.

The breakover voltage ($V_{BO}$) of the device 30 is primarily a function of the distance 54 between the buried region junction 40 and the upper surface 56 of the semiconductor wafer. In addition, and as noted above, the impurity concentration of the buried regions 38 also determines the breakover voltage characteristics of the device 30. In accordance with an important feature of the invention, the breakover voltage of the device 30 is determined, in part, by the distance 54, which is independent of the holding current characteristics. The holding current characteristics are determined primarily by the distance 52. Not only can a high impurity concentration buried region 38 be utilized without the attendant problem of short circuiting with the emitter-base junction 48, but the device made according to the invention renders the breakover voltage characteristics independent of the holding current characteristics.

As noted above, an insulating dielectric 46 overlies the buried region 38. The reason for this is that when the device is subjected to an overvoltage, initial breakdown occurs as current flows from the bottom base region 36 to the emitter 42, via the buried region 38. With multiple buried regions, multiple current paths are initially formed, thereby providing a high surge current capability. To force the initial current during breakdown to pass through the emitter region 48 and through the emitter contact 44, the base region above the buried region 38 is covered with the insulator 46. Otherwise, if the metal contact 44 extended over the buried region 38, current would bypass the emitter region 42 and pass directly to the emitter contact 44. Once the current through the device 30 reaches the switching current ($I_s$), the on-state of the device is maintained and current flow need not pass through the buried region 38. It can be appreciated from the foregoing that the lateral distance between the emitter region 42 and the buried region 38 should be small to increase the turn-on speed of the device, as well as to reduce the initial overshoot during turn on. In the fabrication of a bidirectional SIDACtor® device, two devices (one shown in FIG. 2) can be utilized, one formed in the top surface of the substrate, and the other device formed in the bottom surface.

Figure 3:
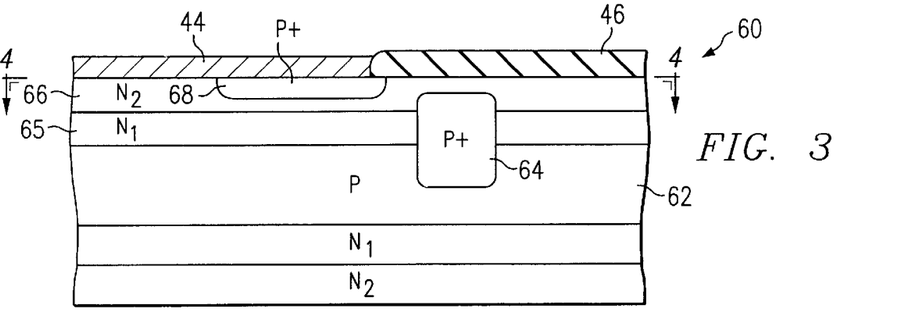
FIGS. 3 and 4 are respective cross-sectional and top views of yet another embodiment of a low voltage SIDACtor® device having a deep base region to effectively make the mid-region of the substrate thinner, thereby reducing the holding current characteristics of the device.
Figure 4:
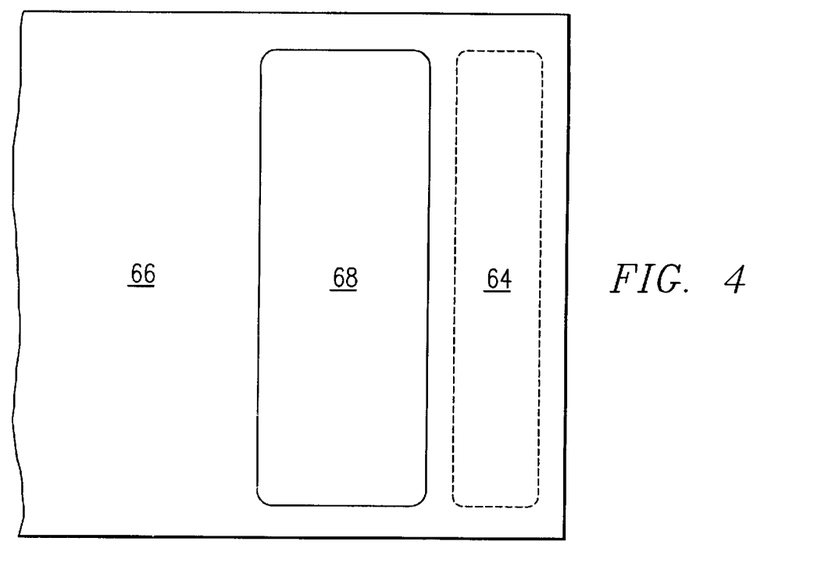

FIG. 3 illustrates another embodiment 60 of the invention having double base regions formed on the top surface of the substrate, and double base regions formed on the bottom surface of the substrate. In the example shown, the substrate or mid-region 62 is employed, and one or more buried regions 64 are formed therein in the manner noted above with reference to FIG. 2. A first thick base region 65 is formed in the top surface of the substrate, and doped with an N-type impurity to achieve an 8–10 ohm per square resistivity. A second thinner base region 66 is formed in the first base region 65. The base region thicknesses are not shown to scale in the drawings. The second base region 66 is formed at a higher N-type impurity level at the surface of about $3 \times 10^{19}$ atoms per cubic centimeter. The heavily doped N-type base region 66 and the heavily doped P-type buried region 64 allow a junction to be formed therebetween. In the top base 66 there is formed a P-type emitter 68. Again, the buried region 64 is laterally offset with respect to the emitter region 68, thereby making the breakover voltage characteristics independent of the holding current characteristics. In addition, by utilizing a double base region in the top and bottom surfaces of the substrate 62, the mid-region 62 is thereby effectively narrowed. The P-type mid-region 62 corresponds to the base of an NPN transistor which forms one-half of the thyristor device. By making the mid-region 62 thinner, and thus the base region of the NPN transistor thinner, the gain of the device is improved and the initial breakover characteristic is improved to reduce the overshoot. Overshoot is considered to be a positive current/voltage slope of the device once breakover ($V_{BO}$) begins to occur. FIG. 4 is a top view of the device 60, taken along line 4—4 of FIG. 3.

Figure 5:
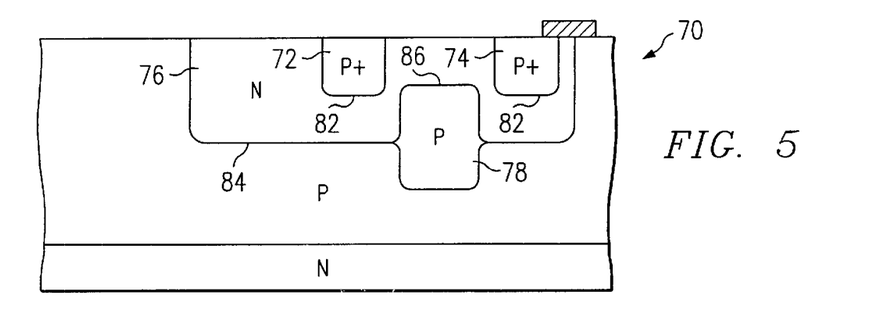
FIGS. 5 and 6 are respective cross-sectional views of a low voltage SIDACtor® device utilizing a buried region disposed between emitter regions.
Figure 6:
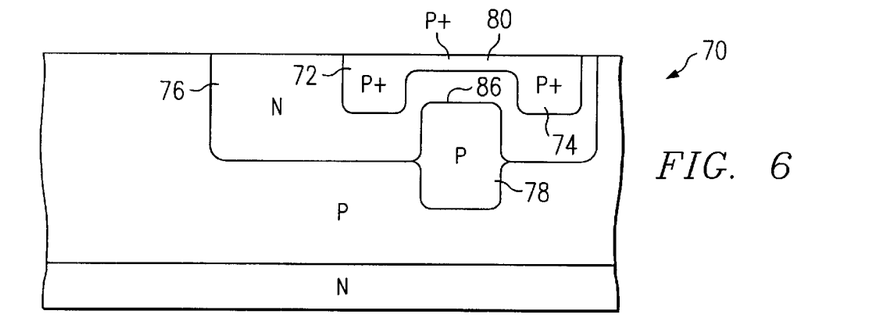

FIGS. 5 and 6 illustrate another embodiment of a thyristor device 70 in which the emitter configuration is modified. Here, a pair of spaced-apart P-type emitters 72 and 74 are formed in the N-type base region 76. Indeed, each emitter region 72 and 74 is spaced on each side of the buried region 78. As noted in the next step of the process shown in FIG. 6, additional P-type impurities are diffused into the top surface of the base region to form a bridge 80 that thereby short circuits the emitters 72 and 74 together. The bridge 80 should be sufficiently thin to maintain a separation with the junction 86 of the buried region 78. The bottom surface of the junction 82 of each emitter region 72 and 74 can thus be formed as close to the junction 84 as necessary, to improve the gain and turn-on characteristics of the device. Again, the distance between the junction 82 and the junction 84 is independent of the location of the junction 86 formed at the top of the buried region 78.

Figure 7:
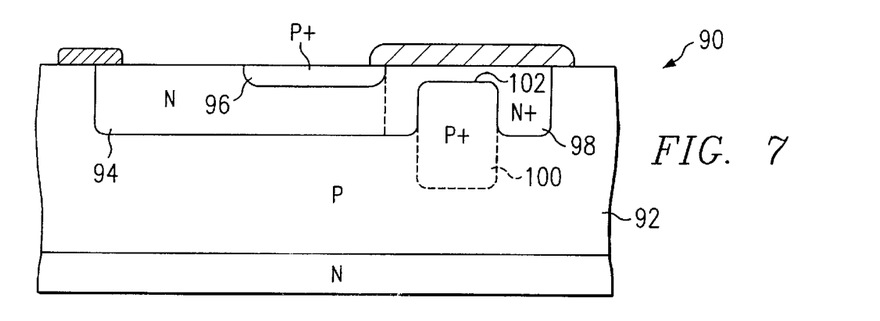
FIG. 7 is a cross-sectional view of a low voltage SIDACtor® device utilizing a base region that has a portion thereof that is lightly doped for improved turn-on performance, and a more heavily doped portion of the base region to control the breakover voltage.

With reference now to FIG. 7 there is illustrated another embodiment 90 of the invention. Here, there is shown a P-type mid-region 92, an N-type base region 94 and a P-type emitter 96 formed therein. The first base region 94 is highly doped and underlies the emitter region 96. Disposed laterally at the side of the emitter 96 is a more heavily doped second base region 98. A buried region 100 forms a junction 102 in the heavily doped second region 98. Since the more heavily doped base region 98 does not underlie the emitter 96, the turn on characteristics of the device are not substantially affected. With this arrangement, the breakover voltage can be reduced further, thus providing overvoltage protection to low voltage communication lines.

Figure 8:
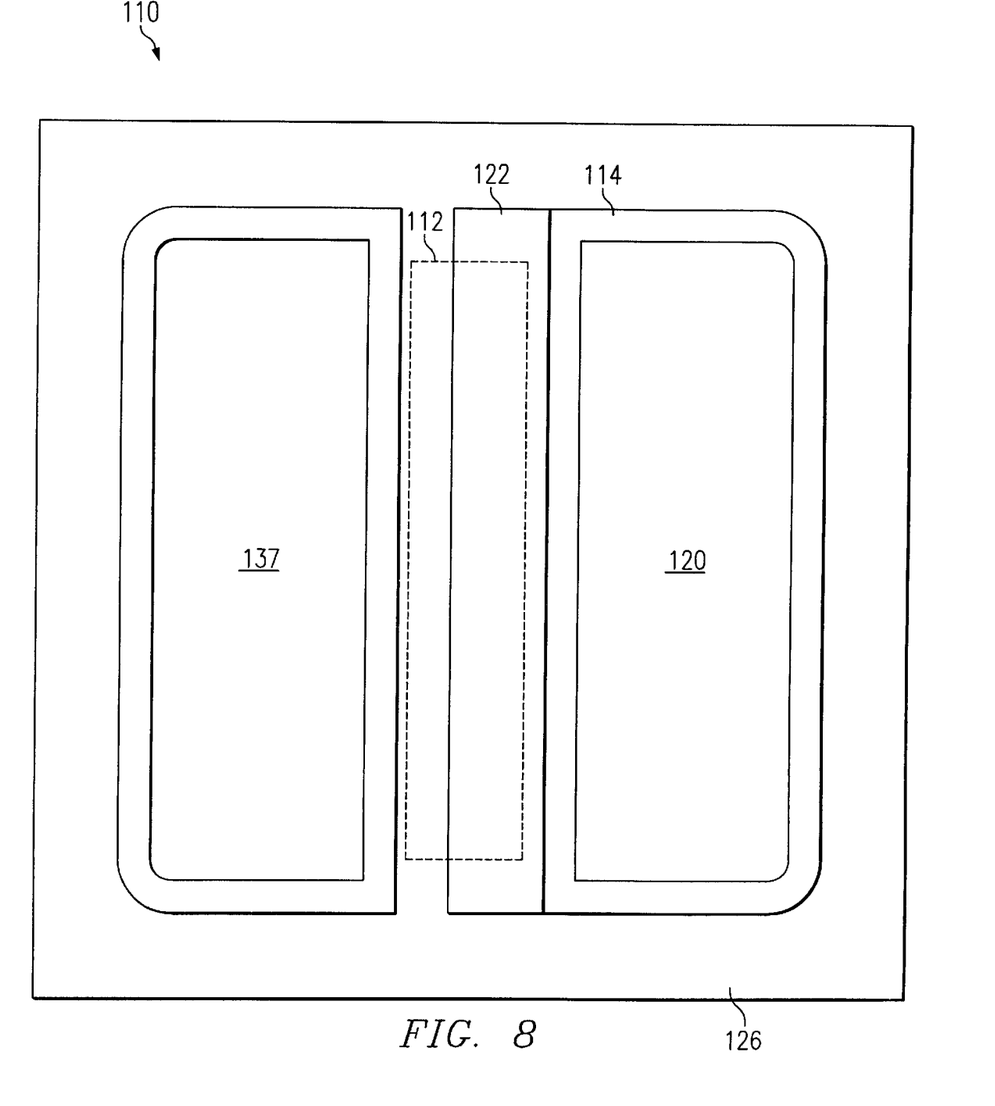
FIGS. 8 and 9a are respective top and sectional views of yet another embodiment of the invention, in which the device is considered a "center-fired" device in that the buried region is centrally located in the semiconductor chip.
Figure 9A:
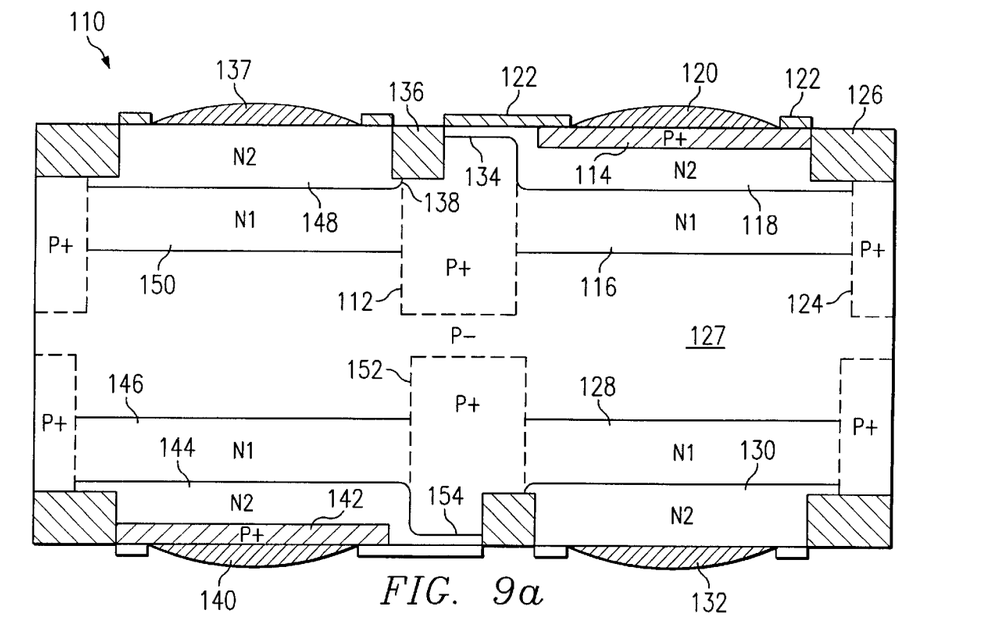

Another embodiment of the invention is shown in FIGS. 8 and 9a. This thyristor device 110 also includes a buried region 112 that is laterally offset with respect to an emitter region 114. Rather than placing the buried region 112 near an edge of the chip, the buried region 112 is located generally in the central portion of the chip. As will be described in more detail below, the center-fired design allows the metal contact areas to be larger, thereby providing a larger current-carrying capability. Two symmetrically-oriented surface contacts are located on each side of the wafer, thereby allowing easier centering of the device within a lead frame during assembly of the packaged device.

The thyristor device 110 shown in FIGS. 8 and 9 includes a first base region 116 and a second base region 118, providing the same advantages noted above in connection with the embodiment of FIG. 3. A metal cathode contact 120, such as solder, is formed in electrical contact with the emitter region 114. The solder contact 120 is bounded by silicon oxide 122. Formed at the same time as the central buried region 112 is another buried region 124 formed at the edge of the chip. The buried region 124 functions to terminate the junction of the two base regions 116 and 118. An insulating material, such as glass 126, formed in a trench serves to prevent the edge-located buried region 124 from initiating conduction of carriers toward the emitter 114. Rather, electron conduction is initiated through the central buried region 112.

One unidirectional device of the thyristor involves the central buried region 112, the emitter 114, the upper two base regions 116 and 118, the mid-region 127, as well as the lower two base regions 128 and 130. A lower contact 132 functions as the anode to the first unidirectional device of the thyristor 110. Assuming the thyristor 110 is biased so that the cathode contact 120 is positive with respect to the anode contact 132, electron current flows from the anode 132 through the bottom base regions 128 and 130, through the mid-region 127 and into the central buried region 112. Initial electron current does not flow directly through the upper base regions 116 and 118, but first through the central buried region 112. From the top junction 134 of the buried region 112, electrons flow into the upper N2 base region 118 and into the emitter region 114, whereupon thyristor conduction begins. Current flows from the emitter region 114 and out of the cathode contact 120. Once conduction is initiated by way of the central buried region 134, current thereafter flows directly from the mid-region 127 through the upper N1 and N2 base regions 116 and 118 into the emitter 114.

The glass-filled trench insulation regions 126 and 136 function to prevent initiation of current flow, except through the central buried region junction 134 to the emitter 114. The glass-filled trench 136 prevents initial electron current from flowing through the central buried region 112 into a metal anode contact 137 formed in the top surface. This is because the breakdown voltage of the top junction 134 of the central buried region 112 is lower than the breakdown voltage at the side junction indicated by reference numeral 138. The breakdown voltage of the side junction 138 of the buried region 112 under the glass 136 is greater than that of the top junction 134. The reason for the difference in breakdown voltages is that the impurity concentration of the buried region 112 at the side junction 138 is less than that at the top junction 134. As noted above, the heavily doped central buried region 112 is formed by a long-term diffusion process which naturally results in an impurity concentration gradient between the upper and lower portions of the central buried region 112. According to the diffusion process, the impurity concentration of the upper part of the central buried region 112 is greater than the impurity concentration located therebelow. With a lower impurity concentration at the side junction 138, the breakdown voltage is naturally higher than that at the top junction 134. As a result, the top junction 134 of the central buried region 112 reaches breakdown first, whereupon initial electron current flow is through the top of the central buried region 112 to the emitter 114. The same principle operates in conjunction with the edge buried region 124 and the glass-filled trench 126. It is noted that the depth of the glass-filled trench boundaries 126 and 136 are formed at the same depth. Indeed, the insulating glass 126 and 136 are formed about the periphery of the device, and formed at the same time in a single peripheral trench.

In the event it is desired that a higher switching current be achieved in the device, the depth of the glass 136 can be less, thereby raising the upper edge of the side junction 138, thus reducing the breakdown voltage at that location. With a lower breakdown voltage, some current tends to pass from the central buried region 112 into the left N2 region 148 and out the metal anode contact 136. As will be described more fully below, the top metal contacts 120 and 137 are short circuited together by a lead frame, and the lower contacts 132 and 140 are short circuited together by another lead frame.

The other bidirectional device of the thyristor 110 includes a bottom emitter 142 in contact with the bottom cathode contact 140. The two lower base regions 144 and 146 are associated electrically with the emitter 142. The upper two base regions 148 and 150 are associated with the anode contact 137. Current flow in the second bidirectional device is from the anode contact 137 to the cathode contact 140. As with the other unidirectional device described above, initial electron current flows from the anode contact 137 through the two upper base regions 148 and 150, through the mid-region 127 and into the lower, central buried region 152. Electron current flows out of the bottommost junction 154 of the buried region 152, through the heavily doped lower base region 144 and into the emitter 142. Once conduction is initiated, current does not pass through the buried region 152, but rather through the lower base regions 144 and 146 into the emitter 142 and out of the cathode contact 140. The various insulator glass and silicon oxide regions shown formed in the bottom of the semiconductor chip 110 provide the same function as those described above in connection with the top of the semiconductor chip 110. As can be appreciated, if the overvoltage to which the thyristor device 110 is subjected is an AC signal, then the unidirectional devices will conduct alternately based on the positive and negative cycles of the AC signal.

Figure 9B:
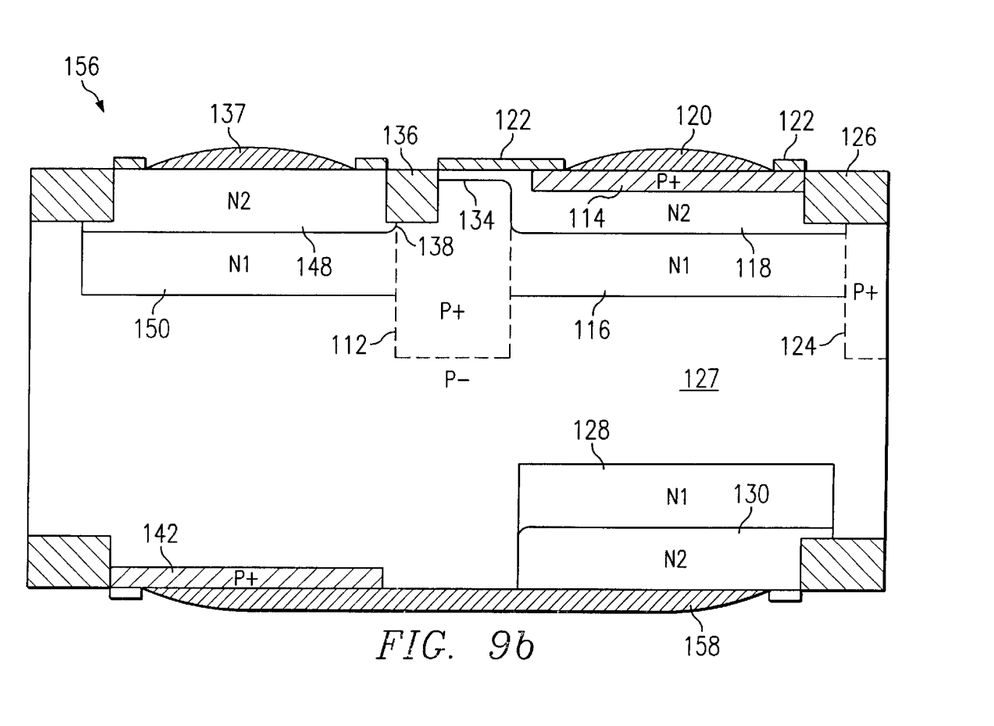
FIG. 9b is a cross-sectional view of another embodiment of the invention with semiconductor areas formed so that the entire device functions as a low voltage Zener diode.

FIG. 9b illustrates an embodiment of the invention that functions in a manner similar to a low voltage Zener diode.

The semiconductor regions formed in the right-most part of the semiconductor chip 156 function in the same manner noted above to produce an overvoltage protection device when a negative voltage is applied to the bottom contact 158 and a more positive voltage is applied to the top contact 120. When the voltage applied across the device is reversed, the semiconductor regions on the left function as a diode bridged across the other unidirectional device. The N-type regions 148 and 150 together with the P-type regions 127 and 142 define the diode. In this embodiment, only a single bottom contact 158 is necessary.

Figure 10:
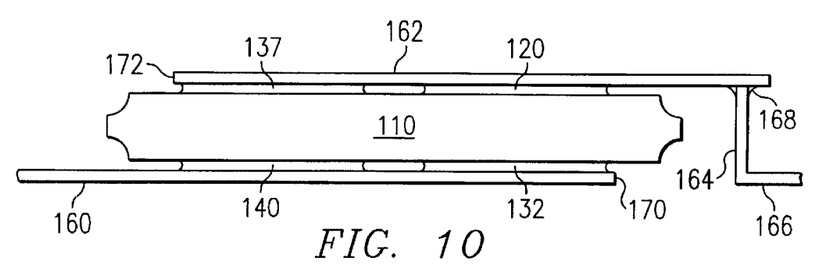
FIG. 10 is a side view of a thyristor device soldered to lead frame members.

FIG. 10 is a side view of the thyristor device 110 as assembled in connection with a first lead frame 160 and a metal preform 162. As can be seen, the top cathode contact 120 and top anode contact 137 are soldered to the top preform 162, and thus short circuited together. In like manner, the bottom anode contact 132 and bottom cathode contact 140 are soldered to the bottom lead frame 160 and are thereby short circuited together. The top preform 162 is soldered to an up-turned end 164 of a second lead frame 166. The joint 168 between the second lead frame 166 and the preform 162 is reflow soldered at the same time as the solder contacts of the thyristor device 110 are reflow soldered to the respective preform 162 and first lead frame 160. Due to the surface tension inherent in the liquified solder, the edge 170 of the first lead frame 160 tends to become self-aligned with the edge of the bottom anode contact 132. Similarly, the edge 172 of the preform 162 tends to become self aligned with the edge of the soldered anode contact 137. This self centering of the thyristor device with respect to the first lead frame 160 and the preform 162 helps prevent misalignment of the device with respect to the lead frames and thus increases assembly yield of the resulting semiconductor structure. Were it not for the symmetry between the edges of the various solder contacts of the thyristor device 110 and the lead frames, registration of the components would be more difficult. In the event that the thyristor device 110 becomes misaligned with the lead frames, the assembly will not correctly fit into the mold for final packaging and encapsulation of the device.

As noted above, another advantage of the symmetry between the top solder contacts 120 and 137 and the bottom solder contacts 132 and 140 is that larger area contacts can be formed to thereby facilitate increased current capability of the device. This symmetry can be achieved because the buried regions 112 and 152 are formed in vertical alignment. In practice, it has been found that the effective conduction area of the metallized emitter of FIG. 2 was about 883 square mils (0.57 mm$^2$), whereas the corresponding area of both top contacts of the embodiment shown in FIG. 8 is about 1111 square mils (0.72 mm$^2$).

Figure 11:
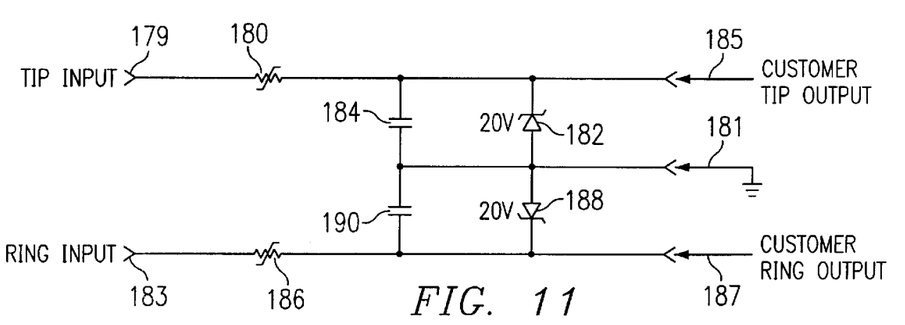
FIGS. 11 and 12 are respective circuit diagrams of low voltage communication line protection circuits.

FIG. 11 illustrates a 5-pin, low voltage communication line protection circuit for providing twenty volt protection to circuits (not shown) connected to the customer tip and ring conductors. The protection circuit is useful in providing low voltage protection to telephone signaling lines that are typically employed to report alarms and the status of banks or series of printed circuit cards. These signaling lines constitute private communication channels used to communicate between a central office and remotely located terminals or cabinets. Such lines are not powered by the standard 48 volt supply but rather are low voltage operating circuits.

The tip conductor 179 is connected in series with a positive temperature coefficient (PTC) element 180 to the customer tip conductor 185. The PTC element 180 produces about four—ten ohms resistance up to about 300 ma flowing therethrough. Should the tip line current increase, the resistance of PTC element 180 increases to provide overcurrent protection to the customer side circuits. When the tip line current is reduced, the resistance of the PTC element 180 returns to its original value. Bridged between the customer tip conductor 185 and ground 181 is a twenty volt Zener diode 182. A small value capacitor (470 pF) 184 functions to filter, condition and stabilize the signal line. The outside ring conductor 183 is similarly situated, in that it is connected in series with a PTC element 186 to the customer ring conductor 187. A second Zener diode 188 provides twenty volt protection to the customer ring equipment. The Zener diodes 182 and 188 can be of the type shown above in conjunction with FIG. 9*b*. A capacitor 190 provides the same function to the ring conductor 183 as capacitor 184 provides to the tip conductor 179.

While the low voltage protection circuit of FIG. 11 utilizes Zener diodes 182, 188, the four-layer devices described above in connection with FIGS. 1–9*a* can be used with equal effectiveness in place of the Zener diodes 182, 188. Zener diodes can be fabricated by maintaining only a single unidirectional device as described above in connection with FIG. 9*b*, and replacing the other unidirectional device with an effective PN junction. Those skilled in the art can readily appreciate the manner in which the various semiconductor regions can be modified by masking and diffusion techniques to provide a diode in parallel with the other unidirectional thyristor device.

When packaging or otherwise implementing the circuit of FIG. 11 in a module, it is not necessary to utilize the entire circuit. Rather, when it is desired to protect only the customer tip conductor 185 from hazardous voltages appearing on the outside tip conductor 179, then the capacitor 190 and Zener diode 188 can be omitted. Only a three-in module may be necessary in this instance to provide protection to one line or conductor. The converse is also true if hazardous voltage protection is necessary to only the customer ring conductor 187.

Figure 12:
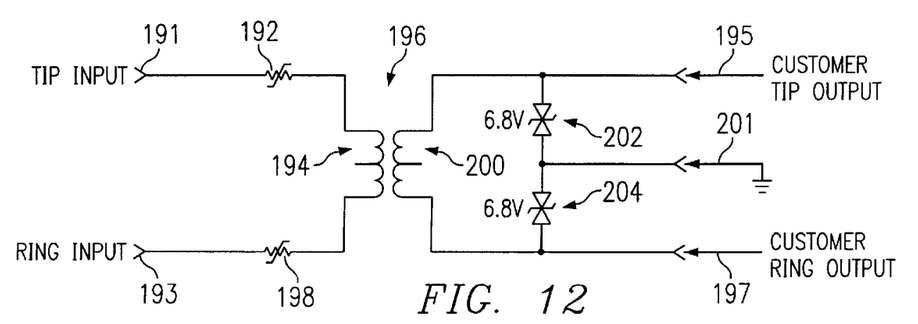

FIG. 12 illustrates yet another embodiment of a low voltage protection circuit that utilizes a transformer 196. Such an arrangement can be employed for connection to standard T1 or E1 digital transmission, or many other types of lines. In this embodiment, the tip conductor 191 is connected through a PTC element 192 through the primary 194 of the transformer 196. The other terminal of the transformer primary 194 is coupled through another PTC element 198 to the ring conductor 193. The transformer secondary 200 has one terminal connected to a customer tip conductor 195, and another terminal connected to a customer ring conductor 197. Connected between the customer tip conductor 195 and ground 201 is a back-to-back Zener diode arrangement 202 providing bidirectional protection in the neighborhood of about 6.8 volts to the customer tip conductor 195. A second bidirectional Zener diode arrangement 204 is coupled between the customer ring conductor 197 and ground 201 to provide bidirectional protection to the customer ring conductor 197.

The transformer 196 is effective to block any DC voltage that may exist on the tip and ring conductors from entering the customer circuits. Some T1 and E1 transmission lines can be powered by 130 volt or 48 volt supplies. The transformer prevents such DC voltages from being coupled to the lower operating voltage equipment of the customer. However, any AC voice, pulse or other similar types of signals are able to be transferred from the transformer primary 194 to the transformer secondary 200 and coupled to the customer circuits. The electrical isolation and other parameters provided by the transformer 196 may be of the type satisfying the recognized standards of UL 497A, CSA C22.2 NO. 950-95 and UL 1950 (3rd edition).

The line conditioning and protection circuit of FIG. 12 is well adapted for those situations where the outside line conditions are not well identified or known, and where the protection of the inside or customer circuits is important. For example, where there may be numerous lines incoming from various destinations and different applications where the electrical properties, operating conditions and characteristics of the lines may not be known, the protection module or circuit of FIG. 12 can be used to isolate all external DC voltages from the customer circuits but still allow the AC information to be transferred. The interfacing of the many outside lines to the customer circuits can be achieved by utilizing a bank of five-pin sockets, where each socket has pins connected to the outside lines, the customer lines, and a ground connection. A module with a protection circuit such as described above can be plugged into the socket to provide the type of protection desired. If different lines require different types of electrical protection, then a module with a different circuit therein can be utilized. The modules can be color coded or otherwise visually distinguished to identify the different circuits therein.

The modularized line conditioning and protection circuits can facilitate compliance with new or modified standards and specifications. In those situations where there already exists the primary and secondary protection circuits, the circuits shown in FIGS. 11 and 12, and yet other circuits, can be incorporated with the existing protection circuits to establish compliance with the new standards or specifications. The integration of the new protection circuits can be facilitated by incorporating the same into modular form adapted for plugging into standardized sockets. The adaptation of the new circuits can even be achieved in these instances by incorporating the standard secondary protection circuits with the new conditioning and protection circuits into the same module, and plug such module into the socket that previously held the standard secondary protection module. This feature allows the incorporation of the new protection scheme without having to wire, rewire or make connections to the existing communication lines.

Figure 13:
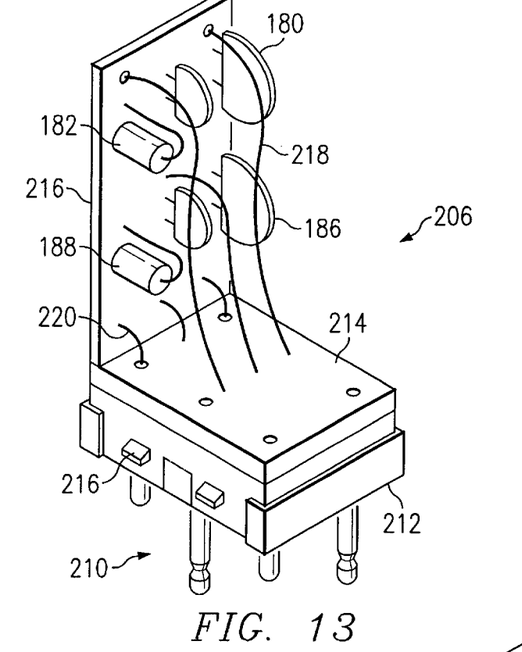
FIGS. 13 and 14 are five-pin protection modules embodying the respective low voltage protection circuits shown in FIGS. 11 and 12.

The low voltage protection circuits of FIGS. 11 and 12 can be incorporated into five-pin modules for easy use and plugability into customer communication interface equipment. With reference to FIG. 13, there is illustrated the telephone line protection circuit of FIG. 11 assembled in a five-pin module structure 206. The five pins 210 of the module are arranged in a standard configuration well known in the art. The pins 210 are fixed within a plastic molded base 212. A first printed circuit board 214 has conductive paths soldered to the respective pins 210. A second printed circuit board 216 is fabricated to hold the electrical components shown in FIG. 11. Various wire conductors 218 and 220 serve to connect the various conductors of the second printed circuit board 216 to the first printed circuit board 214 so that the circuit configuration operates electrically as shown in FIG. 11. The conductors 220 also support the second printed circuit board 216 vertically with respect to the first printed circuit board 214. A plastic molded cover 222 (FIG. 15) is molded to snap fit to the base 212 by way of the small openings 224 formed in the cover. The openings 224 are snap fit around corresponding bosses 216 extending from sides of the module base 212. As noted above, the Zener diodes 182 and 188 can be used as the low voltage thyristor devices described above, and packaged in diode-shaped packages. Other package configurations, including the well-known TO style packages can be easily soldered to the printed circuit boards.

Figure 14:
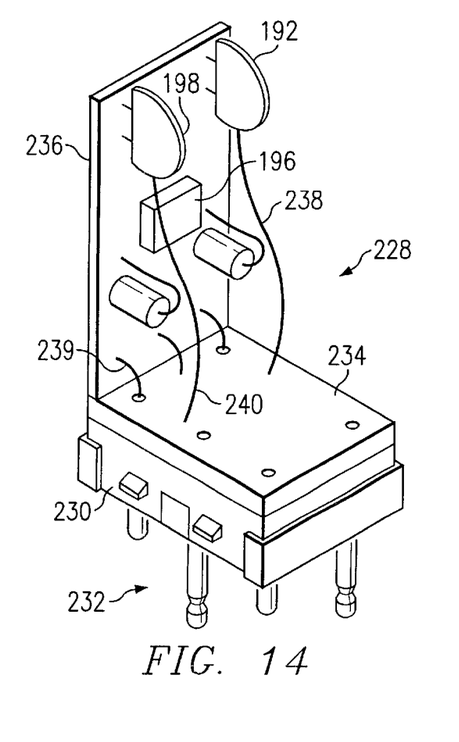

With reference now to FIG. 14, there is illustrated a five-pin module 228 incorporating the components of the low voltage protection circuit of FIG. 12. Again, there is a standard configuration five-pin molded base 230 to which the five pins 232 are fixed. A first printed circuit board 234 has conductive paths soldered to the respective pins 232. A second upright printed circuit board 236 is wired to the first printed circuit board 234 by a number of wire conductors 238 and 239. One terminal of each PTC element 192 and 198 is connected to the respective conductive paths of the second printed circuit board 236, while the other respective terminals 238 and 240 are connected directly to the first printed circuit board 234. The various printed circuit board conductive paths and components shown in FIG. 14 are arranged to provide the functions of the electrical circuit shown in FIG. 12.

Figure 15:
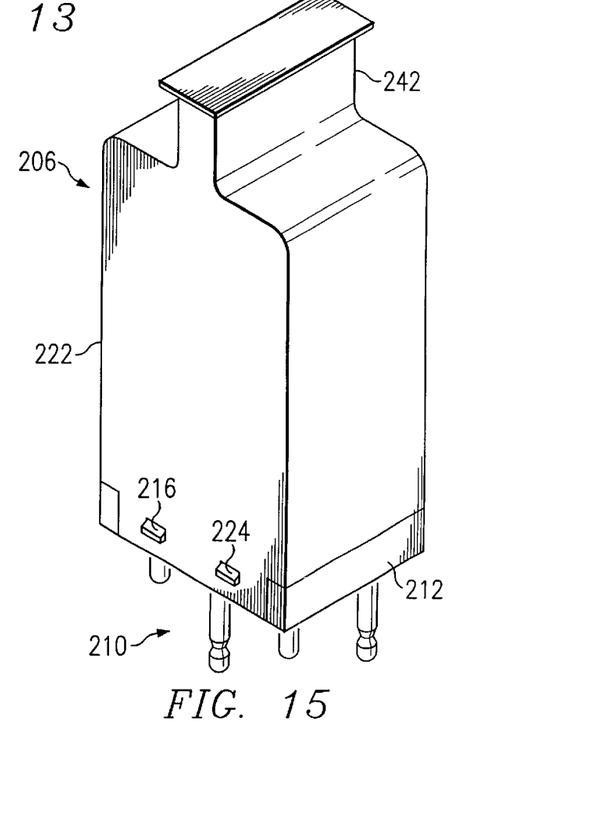
FIG. 15 is an isometric view of a five-pin protection module utilizing low-voltage protection circuits.

FIG. 15 illustrates a completed low voltage five-pin protection module 206 that may house the components of either circuit shown in FIG. 13 or FIG. 14. A finger-grip handle 242 molded as part of the cover 222 permits easy installation or replacement of the low voltage protection circuits in the customer equipment racks. The standard five-pin module configuration can be utilized to provide low voltage protection to various types of customer equipment that operates with low voltage signals carried on the lines. Indeed, the low voltage protection circuits and devices described above need not provide protection to voltages to which standard twisted pair telephone lines may be exposed, but rather to other digital and low-level signal lines that may never be exposed to lightning or power line voltages. Rather, many types of digital and analog communication lines may require protection from inside power sources, such as DC or AC power supplies which may be inadvertently coupled to the customer equipment, or where other circuits fail and allow damaging voltages between 5–50 volts to be coupled to the customer equipment. The various devices, circuits, modules and combinations thereof can be adapted for use with these and many other applications.

From the foregoing, numerous embodiments of the invention have been disclosed. In any of the embodiments, a breakover voltage of the device can be achieved sufficiently low for protecting TTL digital or other low voltage analog or digital lines, and the like. In addition, other equipment susceptible to extraneous high voltages can be protected with S the foregoing devices. A common characteristics of each of the devices is that the buried region is located laterally and adjacent to the emitter so that the position of the junction of the buried region is independent of the distance between the emitter-base junction and the base-mid-region junction. Stated another way, with these designs, the breakover voltage is independent of the holding current of the device. By utilizing buried regions one over the other in bidirectional thyristor devices, an economy of semiconductor area is realized. The utilization of metal contact area placement in conjunction with the lead frames allows self-registration between the elements during the reflow solder assembly process.

While the preferred and other embodiments of the invention have been disclosed with reference to specific semiconductor techniques and methods of operation, it is to be understood that changes in detail may be made as a matter of design choices, without departing from the spirit and scope of the invention, as defined by the appended claims. For example, the devices may be fabricated utilizing impurities of the opposite type, other than those disclosed above.

What is claimed is:

1. A bidirectional thyristor device, comprising:
   a first group of semiconductor regions formed in a semiconductor chip for carrying current in response to a positive polarity voltage applied across the device;
   a second group of semiconductor regions formed in the semiconductor chip for carrying current in response to a negative polarity voltage applied across the device; and
   at least one buried region formed in association with each said first and second group of semiconductor regions, said buried regions being formed to define a breakover voltage for said thyristor device, and formed centrally and laterally between two opposite sides of said semiconductor chip.

2. The bidirectional thyristor device of claim 1, further including an emitter region associated with each said first and second group of semiconductor regions, and wherein said buried regions are formed laterally offset from the respective emitter regions.

3. The bidirectional thyristor device of claim 1, wherein said semiconductor chip is formed with an anode and cathode contact for said first group of semiconductor regions, and a different anode and cathode contact for said second group of semiconductor regions.

4. The bidirectional thyristor device of claim 3, wherein said semiconductor chip is formed having an anode and cathode contact on one surface thereof, and the different anode and cathode contact on an opposite side surface of the semiconductor chip.

5. The bidirectional thyristor device of claim 4, wherein the anode and cathode contacts on one side of said semiconductor ship define different contacts that are short circuited together by a lead frame.

6. The bidirectional thyristor device of claim 3, further including in combination a top lead frame soldered to a top pair of contacts defining a first get of anode and cathode contacts, and a bottom lead frame soldered to a pair of contacts defining a second set of anode and cathode contacts.

7. The bidirectional thyristor device of claim 2, wherein there is formed in one surface of said semiconductor chip at least one first base region and said emitter formed thereover, at least one second base region laterally spaced from said first base region, and a buried region formed between said first and second base regions.

8. The bidirectional thyristor device of claim 7, further including a PN junction between said buried region and said second base region, and including an electrically isolating material formed down into said junction to prevent current flow between said buried region and said second base region.

9. The bidirectional thyristor device of claim 1, wherein said second group of semiconductor regions are formed substantially identical to said first group of semiconductor regions, said first and second groups of semiconductor regions being formed in opposite faces of said semiconductor chip.

10. The bidirectional thyristor device of claim 7, further including a first metal contact electrically connected to said emitter, and a second metal contact electrically connected to said first base region, said first and second metal contacts being of substantially the same area when viewed from a top view.

11. A method of fabricating a bidirectional thyristor, comprising the step of:
   forming a first structure in a surface of a semiconductor chip by:
   forming at least one base region in said surface of the semiconductor chip;
   forming a buried region centrally in said semiconductor chip, said buried region forming a PN junction with said base region;
   forming an emitter region laterally offset with respect to said base region; and
   forming in a second surface of said semiconductor chip a second structure having a base region, a buried region and an emitter region formed in substantially the same manner as the regions of said first structure.

12. The method of claim 11, further including forming a first contact on said base region of said first structure, and forming a second contact in electrical contact with said emitter region of said first structures.

13. The method of claim 12, further including forming the first and second contacts with about the same size area.

14. The method of claim 13, further including soldering the first and second contacts to a lead frame so that said contacts are short circuited together.

15. The method of claim 11, further including forming an electrical isolation in a portion of said PN junction to prevent current flow from said buried region away from said emitter region.

16. The method of claim 11, further including forming said buried regions so that said thyristor exhibits a breakover voltage of between about five volts and about fifty volts.

17. The method of claim 16, further including incorporating said bidirectional thyristor in a module having pins for plugging into a socket.

18. The method of claim 11, further including providing a lead frame with a predefined shape and orientation; and
   forming a contact layout on said semiconductor chip so that when soldered to said lead frame, a surface tension of the liquefied solder self aligns the semiconductor chip with said lead frame.

19. A bidirectional thyristor device, comprising:
   a mid-region defined by a semiconductor substrate;
   at least one base region formed in each of opposing top and bottom faces of said semiconductor substrate;
   a buried region formed in each said opposing face of said semiconductor substrate, said buried regions having an impurity concentration defining respective breakover voltages, and said buried regions being formed generally laterally centralized between opposing sides of said semiconductor substrate, and through said respective base regions into said mid-region;
   an emitter region formed in each of said opposing faces of said semiconductor substrate in respective said base regions, and laterally offset from said respective buried regions;
   first and second metal contact formed on a top face of said semiconductor substrate, said first contact being formed in electrical contact with one said emitter region, and said second contact being formed in electrical contact with one said base region; and
   a third and fourth metal contact formed on a bottom face of said semiconductor substrate, said third contact being formed in electrical contact with another said emitter region, and said fourth contact formed in electrical contact with another said base region.

20. The bidirectional thyristor thyristor device of claim 19, wherein said first and second metal contacts are separate metal contacts, and said third and fourth metal contacts are separate metal contacts.

21. The bidirectional thyristor device of claim 20, further including in combination, a lead frame, a first member of said lead frame being soldered to said first and second metal contacts to thereby short circuit said first and second metal contacts together, and a second member of said lead frame being soldered to said third and fourth metal contacts to thereby short circuit said third and fourth metal contacts together.

22. The bidirectional thyristor device of claim 19, wherein said buried regions form respective PN junctions with said respective base regions, and further including an electrical isolation formed in a portion of said PN junctions to direct current flow from the respective buried regions to the respective emitter regions.

23. The bidirectional thyristor device of claim 22, wherein said electrical isolation formed in said PN junction is effective to prevent current flow from said buried region to an anode contact.

* * * * *